(12) United States Patent
Weiss

(10) Patent No.: US 10,393,775 B2
(45) Date of Patent: Aug. 27, 2019

(54) CURRENT-MEASURING DEVICE AND METHOD FOR DETERMINING AN ELECTRIC CURRENT

(71) Applicant: Siemens Aktiengesellschaft, Munich (DE)

(72) Inventor: Roland Weiss, Erlangen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 15/563,735

(22) PCT Filed: Mar. 30, 2016

(86) PCT No.: PCT/EP2016/056914
§ 371 (c)(1),
(2) Date: Oct. 2, 2017

(87) PCT Pub. No.: WO2016/156392
PCT Pub. Date: Oct. 6, 2016

(65) Prior Publication Data
US 2018/0095112 A1   Apr. 5, 2018

(30) Foreign Application Priority Data
Mar. 31, 2015 (DE) .................. 10 2015 205 794

(51) Int. Cl.
*G01R 15/18* (2006.01)
*G01R 15/20* (2006.01)
(Continued)

(52) U.S. Cl.
CPC ......... *G01R 15/185* (2013.01); *G01R 15/181* (2013.01); *G01R 15/202* (2013.01);
(Continued)

(58) Field of Classification Search
CPC . G01R 1/20; G01R 1/22; G01R 11/06; G01R 19/20; G01R 33/0283
(Continued)

(56) References Cited

U.S. PATENT DOCUMENTS 3,323,056 A    5/1967   Haley ..................... 324/117 R
5,241,263 A    8/1993   Naoi et al. ............... 324/117 H
(Continued)

FOREIGN PATENT DOCUMENTS

CN    102608383 A     7/2012    ............ G01R 19/00
DE      3705450 A1    9/1988    ............ G01R 15/20
(Continued)

OTHER PUBLICATIONS

Yang, Yong et al., "Analysis and Test of a Zero-Flux Current Sensor to be Used in ITER," Journal of Fusion Energy, vol. 34, No. 3, pp. 463-468, Dec. 12, 2014.
(Continued)

*Primary Examiner* — Huy Q Phan
*Assistant Examiner* — Raul J Rios Russo
(74) *Attorney, Agent, or Firm* — Slayden Grubert Beard PLLC

(57) ABSTRACT

The present disclosure relates to electrical conductors. The teachings herein may be embodied a current-measuring devices and/or methods for determining an electric current in an electrical conductor. For example, a method for determining a magnitude of an electric current in an electrical conductor may include: measuring output signals from a plurality of magnetic-field sensors arrayed around the electrical conductor; setting a compensation current through a compensation coil surrounding the plurality of magnetic-field sensors based on detected output variables of the magnetic-field sensors; and determining the magnitude of the electric current through the electrical conductor based on the set compensation current through the compensation coil.

13 Claims, 2 Drawing Sheets

(51) Int. Cl.
  *G01R 19/20* (2006.01)
  *G01R 33/07* (2006.01)
  *H01F 27/42* (2006.01)

(52) U.S. Cl.
  CPC ........... *G01R 15/205* (2013.01); *G01R 33/07* (2013.01); *G01R 15/207* (2013.01); *H01F 27/427* (2013.01)

(58) Field of Classification Search
  USPC .......................... 324/72, 76.11–76.83, 117 R
  See application file for complete search history.

(56) References Cited

U.S. PATENT DOCUMENTS

| | | | | |
|---|---|---|---|---|
| 2007/0057662 A1* | 3/2007 | Yakymyshyn | ....... | G01R 15/207 324/117 R |
| 2007/0205749 A1* | 9/2007 | Yakymyshyn | ....... | G01R 15/207 324/117 R |
| 2007/0205750 A1* | 9/2007 | Yakymyshyn | ....... | G01R 15/207 324/127 |
| 2009/0289694 A1* | 11/2009 | Rieger | ................. | G01R 15/205 327/524 |
| 2010/0259246 A1 | 10/2010 | Kim | ............................... | 324/120 |
| 2012/0169328 A1 | 7/2012 | Williams | ...................... | 324/251 |
| 2017/0023625 A1* | 1/2017 | Hsu | ................... | G01R 19/2506 |

FOREIGN PATENT DOCUMENTS

| | | | | |
|---|---|---|---|---|
| DE | 102011110648 A1 | 2/2013 | ............. | G01R 15/18 |
| DE | 102013100246 A1 | 7/2014 | ............. | G01R 15/18 |
| WO | 2016/156392 A1 | 10/2016 | ............. | G01R 15/18 |

OTHER PUBLICATIONS

International Search Report and Written Opinion, Application No. PCT/EP2016/056914, 21 pages, dated Jun. 14, 2016.
Chinese Office Action, Application No. 201680025650.9, 18 pages, dated Jun. 11, 2019.

* cited by examiner

CURRENT-MEASURING DEVICE AND METHOD FOR DETERMINING AN ELECTRIC CURRENT

CROSS-REFERENCE TO RELATED APPLICATIONS

This application is a U.S. National Stage Application of International Application No. PCT/EP2016/056914 filed Mar. 30, 2016, which designates the United States of America, and claims priority to DE Application No. 10 2015 205 794.1 filed Mar. 31, 2015, the contents of which are hereby incorporated by reference in their entirety.

TECHNICAL FIELD

The present disclosure relates to electrical conductors. The teachings herein may be embodied a current-measuring devices and/or methods for determining an electric current in an electrical conductor.

BACKGROUND

Numerous power-engineering applications require the measurement of high electric currents. For this purpose, a magnetic field induced about an electric conductor by the electric current may be detected and evaluated. A detected magnetic field of this kind may provide information on the electric current flowing through the conductor. For this purpose, it is also possible to guide an electrical conductor through an annular so-called flux concentrator. Such a flux concentrator may be made of a ferromagnetic material; as a result of which, the magnetic field lines concentrate around the current-carrying conductor in this flux concentrator. The magnetic field in this flux concentrator can be detected by a magnetic-field sensor, such as a Hall sensor, in a slot in the flux concentrator. However, such flux concentrators made of ferromagnetic or ferrimagnetic materials require a relatively high sensor weight. In addition, measuring errors can also occur as a result of magnetic hysteresis.

SUMMARY

Using the teachings of the present disclosure, a current-measuring device and a method for measuring an electric current in an electrical conductor may allow precise current measurement in the electrical conductor with the greatest possible current measuring range. Furthermore, the teachings herein may allow current measurement in an electric conductor with the lowest possible sensitivity to interference fields.

For example, some embodiments of the present teachings may include a current-measuring device (1) for determining an electric current in an electrical conductor (2), with: a plurality of magnetic-field sensors (10-$i$) arranged around the electrical conductor (2) and configured to provide an output signal corresponding to a detected magnetic field; a compensation coil (20) arranged around the electrical conductor (2), wherein the plurality of magnetic-field sensors (10-$i$) are arranged in the interior of the compensation coil (20); and a controller (21) configured to set an electric compensation current in the compensation coil (20).

In some embodiments, the plurality of magnetic-field sensors (10-$i$) is arranged in a plane extending perpendicular to the direction of current flow through the electrical conductor (2).

In some embodiments, a surface segment of the plane is assigned to each magnetic-field sensor (10-$i$) of the plurality of magnetic-field sensors (10-$i$), and the output signal provided by the respective magnetic-field sensor (10-$i$) is weighted with a weighting factor corresponding to the surface of the corresponding surface segment.

In some embodiments, all the magnetic-field sensors (10-$i$) of the plurality of magnetic-field sensors (10-$i$) have the same distance to a center axis of the electrical conductor (2).

In some embodiments, the magnetic-field sensors (10-$i$) are arranged equidistantly around the electrical conductor (2).

In some embodiments, the controller (21) sets the electric compensation current in the compensation coil (20) based on the output signals provided by the plurality of magnetic-field sensors (10-$i$).

In some embodiments, the controller (21) sets the compensation current in the compensation coil (20) such that the sum of the output signals provided by the plurality of magnetic-field sensors (10-$i$) is zero.

In some embodiments, the compensation coil (20) has a torus-shaped outer geometry.

In some embodiments, the plurality of magnetic-field sensors (10-$i$) comprises magnetoresistive magnetic-field sensors.

In some embodiments, there is an evaluation facility (22) configured to determine the electric current through the electrical conductor (2) based on the electric current flowing through the compensation coil (20).

In some embodiments, the electric current through the electrical conductor is obtained from the product of the electric current through the compensation coil and the (a) number of windings in the compensation coil.

Some embodiments may include methods for determining an electric current in an electrical conductor (2), with the steps: provision (S1) of a plurality of magnetic-field sensors (10-$i$) around the electrical conductor (2); provision (S2) of a compensation coil (20) surrounding the plurality of magnetic-field sensors (10-$i$); detection (S3) of the output variables provided by the magnetic-field sensors (10-$i$); setting (S4) an electric compensation current in the compensation coil (20) based on the detected output variables of the magnetic-field sensors (10-$i$); and determination (S5) of the magnitude of an electric current through the electrical conductor (2) based on the set compensation current through the compensation coil (20).

In some embodiments, the step (S4) for setting the electric compensation current through the compensation coil (20) minimizes the output variables of the magnetic-field sensors (10-$i$).

In some embodiments, the step for setting (S4) the electric compensation current multiplies the output variables of the plurality of magnetic-field sensors (10-$i$) by a weighting factor.

In some embodiments, the step (S5) for determining the magnitude of the electric current through the electrical conductor (2) calculates the electric current from a product of the compensation current through the compensation coil (20) and a number of windings in the compensation coil (20).

BRIEF DESCRIPTION OF THE DRAWINGS

Further embodiments and details of the teachings of the present disclosure are included in the following description with reference to the attached drawings, which show.

DETAILED DESCRIPTION

Figure 1:
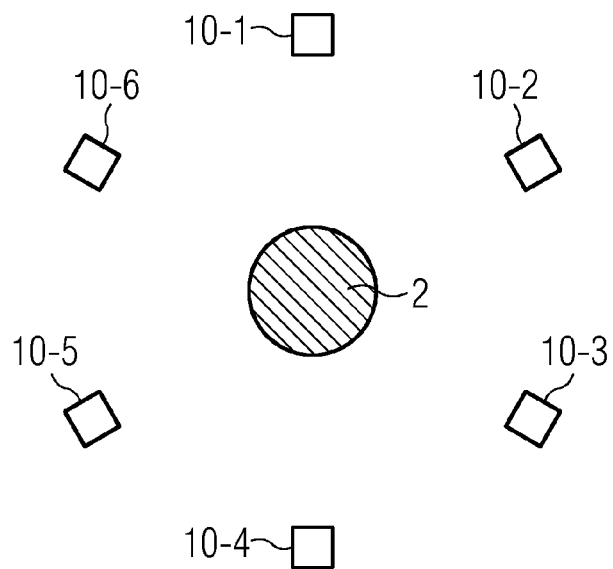
FIG. 1: a schematic representation of a current-measuring device with a plurality of magnetic-field sensors about an electrical conductor in accord with the teachings of the present disclosure.

In some embodiments, the teachings of the present disclosure provide a current-measuring device for determining an electric current in an electrical conductor. The current-measuring device may comprise a plurality of magnetic-field sensors arranged around the electrical conductor. The plurality of magnetic-field sensors are configured to detect a magnetic field and to provide an output signal corresponding to the detected magnetic field. Furthermore, the current-measuring device comprises a compensation coil arranged around the electrical conductor. In some embodiments, the plurality of magnetic-field sensors is arranged in the interior of the compensation coil. Finally, the current-measuring device further comprises a controller configured to set an electric compensation current in the compensation coil.

Some embodiments may include a method for determining an electric current in an electrical conductor. The method may comprise the steps of the provision of a plurality of magnetic-field sensors around the electrical conductor and the provision of a compensation coil surrounding the plurality of magnetic-field sensors. The method furthermore comprises the steps of the detection of the output variables provided by the magnetic-field sensors, setting an electric compensation current in the compensation coil based on the detected output variables of the magnetic-field sensors; and the determination of the magnitude of an electric current through the electrical conductor based on the set compensation current through the compensation coil.

The teachings of the present disclosure include detecting the magnetic field of an electrical conductor through which an electric current flows by means of a plurality of magnetic-field sensors around the electrical conductor. Herein, simultaneously an electrical current is set in a compensation coil to compensate the detected magnetic field induced by the electrical conductor. This compensation enables very precise determination of the electric current through the electrical conductor.

Due to the principle of compensation, regardless of the electric current through the electrical conductor, the magnetic-field sensors in each case only have to detect a relatively small magnetic field. Current measurement is therefore possible over a very large measuring range.

Unlike conventional current transformers with a magnetic-field concentrator, the embodiments of the present teaching do not require a flux circuit made of ferromagnetic or ferrimagnetic material. This also means that no measuring errors from magnetic hysteresis in the flux concentrator are expected. In addition, the weight of the current-measuring device is lower than that of conventional current-measuring devices with flux concentrators.

In some embodiments, a plurality of magnetic-field sensors arranged around the electrical conductor may also mean that statistical offset errors balance each other out more effectively thus enabling an additional increase in the precision of the current-measuring device.

Since, apart from the magnetic-field sensors, as a rule, the interior of the compensation coil only contains diamagnetic or paramagnetic material, the compensation coil may also have very low inductance. This provides a very high compensation control cut-off frequency for setting the current through the compensation coil. Hence, this enables relatively simple constructions for driving the current through the compensation coil. In addition, the embodiments of the device may have very low sensitivity to external and disturbance fields.

In some embodiments of the current-measuring device, the plurality of magnetic-field sensors is arranged in a plane, wherein this plane extends perpendicular to the direction of current flow through the electrical conductor.

In some embodiments, a surface segment of the plane is assigned to each magnetic-field sensor of the plurality of magnetic-field sensors. Herein, the respective output signal provided by the magnetic-field sensor is weighted with a weighting factor corresponding to the surface of the corresponding surface segment. This enables the magnetic field induced around the electrical conductor by the current flow to be detected correctly even if the magnetic field sensors are not uniformly distributed around the electrical conductor.

In some embodiments, all the magnetic-field sensors of the plurality of magnetic-field sensors have the same distance to a center axis of the electrical conductor. In some embodiments, the magnetic-field sensors are arranged equidistantly around the electrical conductor.

In some embodiments, the controller sets the electric compensation current in the compensation coil based on the output signals provided by the plurality of magnetic-field sensors. In some embodiments, the controller sets the compensation current in the compensation coil such that the sum of the output signals provided by the plurality of magnetic-field sensors is zero. If, herein, the output signals from the individual magnetic-field sensors are weighted differently, the controller set the compensation current in the compensation coil such that the weighted sum of the output signals is zero. This minimizes the magnetic field to be detected by the magnetic-field sensors thus enabling a particularly precise measurement.

In some embodiments, the compensation coil has a torus-shaped outer geometry.

In some embodiments, the plurality of magnetic-field sensors comprises magnetoresistive (MR) magnetic-field sensors. Such magnetic-field sensors, which operate according to the magnetoresistive measuring principle, enable a very exact and precise measurement of magnetic fields with a smaller, lighter and more compact design.

In some embodiments, the current-measuring device comprises an evaluation facility configured to determine the electric current through the electrical conductor based on the electric current flowing through the compensation coil.

In some embodiments, the electric current, in particular the electric current determined by the evaluation facility, is obtained from the product of the electric current through the compensation coil and a number of windings in the compensation coil. This makes it very easy to calculate the current through the electrical conductor.

In some embodiments, the step for setting the electric compensation current through the compensation coil minimizes the output variables of the magnetic-field sensors. In particular, in the step for setting the electric compensation current, the current is set such that the sum, in particular an optionally weighted sum, of the output variables of the magnetic-field sensors is minimal.

In some embodiments, in the step for setting the electric compensation current in the compensation coil, the output variables of the plurality of magnetic-field sensors are multiplied by a weighting factor. Herein, this weighting factor can in particular be obtained from a surface segment assigned to the respective magnetic-field sensor.

In some embodiments, in the step for determining the magnitude of the electric current through the electrical conductor, the electric current is calculated from a product of the compensation current through the compensation coil and a number of windings in the compensation coil.

FIG. 1 is a schematic representation of a high-current sensor according to teachings of the present disclosure. In this representation, six magnetic-field sensors 10-$i$ are arranged around electrical conductor 2. Herein, the magnetic-field sensors 10-$i$ can be arranged on a carrier material, which is not shown here. If an electric current flows through the electrical conductor 2, this induces a magnetic field around the electrical conductor 2. This magnetic field can be detected by the magnetic-field sensors 10-$i$. Herein, the individual magnetic-field sensors 10-$i$ each measure locally (point-by-point) the tangential component of the magnetic field. Then, the summation of these tangential components according to the following formula can be used to deduce the current $I_L$ in the electric conductor:

$$I_L = \sum_i a_i \cdot U_i \cdot \Delta s_i$$

Herein, $U_i$ is the sensor output voltage of the respective magnetic-field sensor 10-$i$, $a_i$ is the sensitivity of the respective magnetic-field sensor 10-$i$, $\Delta S_i$ is a section in the i-th interval on a curve around the electrical conductor 2 on which the magnetic-field sensors 10-$i$ lie.

To provide a current sensor that is as simple and inexpensive as possible, herein, the magnetic field around the electrical conductor 2 should be approximated with as few interpolation points as possible, e.g. as few magnetic-field sensors 10-$i$ as possible. In some embodiments, the geometry of the boundary curve on which the measurement is performed take account of the spatial arrangement of the measured current and the interference current. Therefore, possible boundary curves are e.g., circles, ellipses, equilateral polygons, pentagons, hexagons, etc. In some embodiments, the curve shape allows, in all conceivable operating conditions, if possible, all the sensors to see a similar magnetic field strength in their sensitive direction and that no occasional overloading of individual components falsifies the result.

In some embodiments, there is a simple cylindrical geometry of a straight elongated conductor 2 with a circular cross section, a circular arrangement of the magnetic-field sensors 10-$i$ with the current-carrying conductor 2 in the center, as depicted in FIG. 1. For the discretization of the boundary curve, the magnetic-field sensors 10-$i$ may be arranged as equidistantly as possible and with the same distance to the center point of the electric conductor 2. Herein, regions of the boundary curve with a high degree of curvature or a high disruptive influence can have higher resolution on discretization of the boundary curve, e.g. a greater number of magnetic-field sensors 10-$i$ can be arranged in this region. The number of six magnetic-field sensors 10-$i$ around the electrical conductor 2 selected here only represents an arbitrary example. Depending upon the field of application, it is also possible to select more or fewer magnetic-field sensors 10-$i$ for a current sensor.

Figure 2:
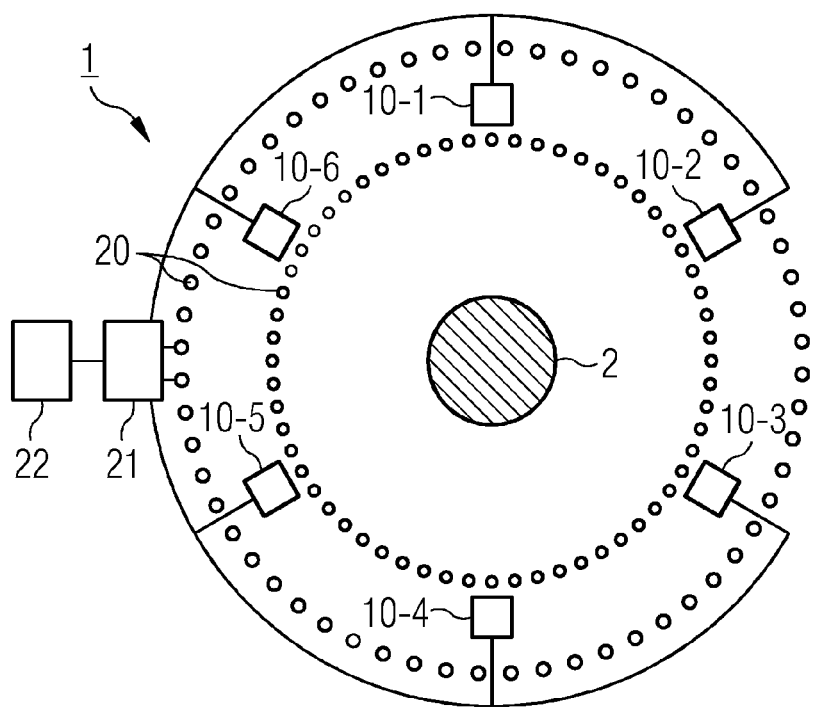
FIG. 2: a schematic representation of a current-measuring device in accord with the teachings of the present disclosure.

FIG. 2 is a schematic representation of a current-measuring device 1 with the above-described measuring principle according to teachings of the present disclosure. Herein, the current-measuring device 1 comprises a plurality of magnetic-field sensors 10-$i$, a compensation coil 20, and a controller 21. For example, the magnetic-field sensors can be magnetoresistive magnetic-field sensors.

Here, the same statements apply to the arrangement of the magnetic-field sensors 10-$i$ around the electrical conductor 2 as in the above explanation in connection with FIG. 1. Therefore, the plurality of magnetic-field sensors 10-$i$ is arranged around the electrical conductor 2 along a curve shape. In some embodiments, the magnetic-field sensors 10-$i$ all have the same distance from the center axis of the electrical conductor 2. It is also possible for all the magnetic-field sensors 10-$i$ to be equidistantly spaced. However, depending upon the application, in particular in the case of possible disruptive influences or a large radius of curvature, etc. other arrangements of the magnetic-field sensors 10-I may be appropriate. Herein, the magnetic-field sensors 10-$i$ may be arranged on a (virtual) plane extending perpendicular to the direction of current flow through the electrical conductor 2. In some embodiments, in the case of a non-equidistant or non-uniform arrangement of magnetic-field sensors 10-$i$ around the electrical conductor 2, herein, a weighting factor $a_i$ can be assigned to each magnetic-field sensor 10-$i$. Herein, this weighting factor $a_i$ can correspond to a surface segment corresponding to the respective magnetic-field sensor 10-$i$ in the (virtual) plane.

In some embodiments, each of the magnetic-field sensors 10-$i$ supplies an output signal, for example an output voltage $U_i$ corresponding to a magnetic field detected by the respective magnetic-field sensor 10-$i$. All these output signals (output voltages) $U_i$ can be supplied to the controller 21.

Unlike the setup shown in FIG. 1, the current-measuring device 1 also comprises a compensation coil 20. This compensation coil 20 is also arranged around the electrical conductor 2. Herein, the magnetic-field sensors 10-$i$ in the current-measuring device 1 are arranged in the interior of the compensation coil 20. Herein, the compensation coil 20 comprises a specified number n of windings.

In some embodiments, the compensation coil 20 is an annular coil. This annular coil can have the shape of a torus. However, other coil geometries for the compensation of the magnetic field induced by the electric current through the electrical conductor 20 are also possible.

In some embodiments, the compensation coil 20 is coupled to the controller 21. Hence, the controller 21 can feed an electric current into the compensation coil 20. The compensation current in the compensation coil 20 induces a magnetic field inside the compensation coil 20, in the space in which the magnetic-field sensors 10-$i$ are located. Herein, this magnetic field inside the compensation coil 20, induced by the compensation current, counteracts the magnetic field caused by the electric current through the electrical conductor 2. In some embodiments, this enables the magnetic field caused by the electric current through the electrical conductor 2 and the magnetic field caused by the compensation current in the compensation coil 20 to compensate one another completely. For this purpose, the controller 21 may evaluate the output signals $U_i$ of the magnetic-field sensors 10-$i$ and set the compensation current through the compensation coil 20 such that the output signals $U_i$ of the magnetic-field sensors 10-$i$ are minimal. For this purpose, the controller 21 may sum of all the output signals $U_i$ of the individual magnetic-field sensors 10-$i$. Herein, if the individual output signals $U_i$ of the magnetic-field sensors 10-$i$ are weighted differently, the controller 21 is also able to take account of the correspondingly weighted sum of the output signals $U_i$ for the control of the compensation current through the compensation coil 20.

The controller 21 may control the compensation current through the compensation coil 20 such that the (weighted) sum of the output signals $U_i$ of the magnetic-field sensors 10-$i$ is minimal, in particular zero if possible. For this purpose, it is quite possible for the individual magnetic-field sensors 10-$i$ each to output an output signal $U_i$ different from zero and for the (weighted) sum of all output signals nevertheless to be zero following the adjustment of the compensation current through the compensation coil 20. Since, the magnetic field caused by the electric current through the electrical conductor 2 and the magnetic field caused by the compensation current through the compensation coil 20 attenuate one another and in the most favorable case completely compensate one another, the magnetic-field sensors 10-$i$ may detect a relatively small magnetic field. An increasing current through the electrical conductor 2 can be balanced out by increasing the compensation current through the compensation coil 2. This makes it possible for the described current-measuring device 1 to be used to detect electric currents through the electrical conductor 2 very precisely over a large measuring region. In particular, very precise measurement of electric currents between 40 A and 100 A is possible. However, it is also possible to acquire and measure lower or higher currents with the current-measuring device 1 with corresponding compensation of the magnetic field through the compensation coil 2.

Herein, as already described above, the controller 21 detects the (weighted) sum of all the output signals $U_i$ of the magnetic-field sensors 10-$i$ and then adjusts the compensation current through the compensation coil 20 such that the (weighted) sum of the output signals $U_i$ of the magnetic-field sensors 10-$i$ is minimal, at best zero. In some embodiments, the electric current through the electrical conductor 2 may be calculated from the product of the number of windings n in the compensation coil 20 and the set compensation current $I_k$.

In some embodiments, the current-measuring device 1 comprises an evaluation facility 22 which determines the electric current through the electrical conductor 2 based on the electric compensation current through the compensation coil 20. In particular, with a known number n of windings in the compensation coil 20, by measuring the compensation current through the compensation coil 20, the evaluation facility 22 can calculate the current through the electric conductor 2 from the product of the compensation current through the compensation coil 20 and the number of windings n in the compensation coil. Then, the evaluation facility 22 can provide an analog or digital output signal corresponding to the determined electric current through the electrical conductor 2.

Figure 3:
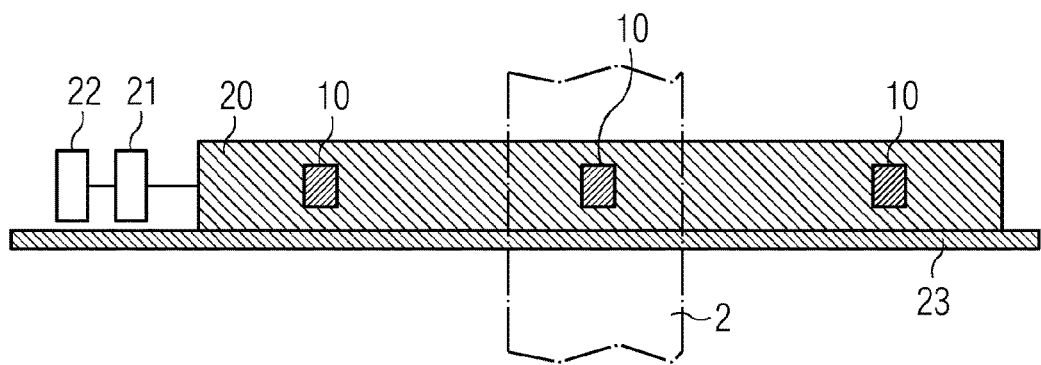
FIG. 3: a schematic representation of a cross section through a current-measuring device in accord with the teachings of the present disclosure.

FIG. 3 is a schematic representation of a cross section through a current-measuring device 1 according to teachings of the present disclosure. The magnetic-field sensors 10-$i$ are arranged in the interior of the compensation coil 20. Herein, the compensation coil 20 and also the individual magnetic-field sensors 10-$i$ can be arranged on a suitable carrier 23. The controller 21 and the evaluation facility 22 can also be arranged on this carrier 23. Herein, as shown in FIG. 3, the individual windings in the compensation coil 20 extend such that the magnetic field caused by an electric current through the electrical conductor 2 and the magnetic field caused by the compensation current through the compensation coil 20 compensate one another.

Figure 4:
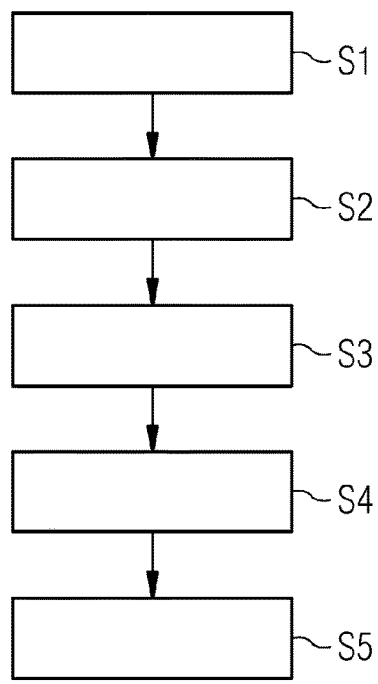
FIG. 4: a schematic representation of a flowchart such as that on which a method for measuring an electric current through an electrical conductor is based in accord with the teachings of the present disclosure.

FIG. 4 is a schematic representation of a flowchart such as that used as the basis for a method for determining an electrical current in an electrical conductor according to teachings of the present disclosure. First, in a step S1, a plurality of magnetic-field sensors 10-$i$ is provided arranged around the electrical conductor 2. Furthermore, in step S2, a compensation coil 20 is provided surrounding plurality of magnetic-field sensors 10-$i$.

Then, in step S3, the output variables provided by the magnetic-field sensors are detected. Herein, these output variables of the magnetic-field sensors 10-$i$ correspond to the magnetic fields detected by the respective magnetic-field sensors 10-$i$. In particular, the output variables $U_i$ can entail a voltage corresponding to the magnetic field detected by the magnetic-field sensors.

In step S4, then, an electrical compensation current is set in the compensation coil 20. Herein, the set compensation current through the compensation coil 20 may be set based on the output variables of the magnetic-field sensors. In some embodiments, the compensation current through the compensation coil 20 is set such that the sum, in particular the weighted sum, of the output variables $U_i$ of the magnetic-field sensors 10-$i$ is minimal, preferably zero. Then, in step S5, the magnitude of the electric current through the electrical conductor 2 can be calculated based on the set compensation current through the compensation coil 20. For this purpose, it is, for example, possible for the set compensation current through the compensation coil 20 to be multiplied by a known number n of windings in the compensation coil 20.

Some embodiments may include a current-measuring device for the galvanically decoupled measurement of high currents through an electrical conductor. In some embodiments, a plurality of magnetic-field sensors is arranged around the electrical conductor. In some embodiments, a compensation coil surrounds the magnetic-field sensors and a compensation current can be set therein. By control of the compensation current, the magnetic field caused by the electric current and the magnetic field largely compensate each other. This enables very precise and disturbance-free measurement of high electric currents over a large dynamic range.

What is claimed is:

1. A current-measuring device for determining an electric current in an electrical conductor, the device comprising:
   a plurality of magnetic-field sensors arrayed around the electrical conductor and providing an output signal corresponding to a detected magnetic field;
   a compensation coil arranged around the electrical conductor;
   wherein the plurality of magnetic-field sensors are arranged in the interior of the compensation coil; and
   a controller setting an electric compensation current in the compensation coil;
   wherein the plurality of magnetic-field sensors are arranged in a plane extending perpendicular to a direction of current flow through the electrical conductor;
   a surface segment of the plane is assigned to each magnetic-field sensor of the plurality of magnetic-field sensors; and
   a respective output signal provided by a respective magnetic-field sensor is adjusted with a weighting factor corresponding to a surface area of the corresponding surface segment.

2. The current-measuring device as claimed in claim 1, wherein all the magnetic-field sensors of the plurality of magnetic-field sensors are arranged at a single distance from a center axis of the electrical conductor.

3. The current-measuring device as claimed in claim 1, wherein the magnetic-field sensors are arranged equidistantly around the electrical conductor.

4. The current-measuring device as claimed in claim 1, wherein the controller sets the electric compensation current in the compensation coil based on output signals provided by the plurality of magnetic-field sensors.

5. The current-measuring device as claimed in claim 1, wherein the controller sets the compensation current in the compensation coil so the sum of the output signals provided by the plurality of magnetic-field sensors is zero.

6. The current-measuring device as claimed in claim 1, wherein the compensation coil has a torus-shaped outer geometry.

7. The current-measuring device as claimed in claim 1, wherein the plurality of magnetic-field sensors comprises magnetoresistive magnetic-field sensors.

8. The current-measuring device as claimed in claim 1, further comprising an evaluation facility to determine the electric current through the electrical conductor based on the electric current flowing through the compensation coil.

9. The current-measuring device as claimed in claim 8, wherein the electric current through the electrical conductor is calculated by taking a product of the electric current through the compensation coil and a number of windings in the compensation coil.

10. A method for determining a magnitude of an electric current in an electrical conductor, the method comprising:

measuring output signals from a plurality of magnetic-field sensors arrayed around the electrical conductor;

setting a compensation current through a compensation coil surrounding the plurality of magnetic-field sensors based on detected output variables of the magnetic-field sensors;

determining the magnitude of the electric current through the electrical conductor based on the set compensation current through the compensation coil;

wherein the plurality of magnetic-field sensors are arranged in a plane extending perpendicular to a direction of current flow through the electrical conductor;

a surface segment of the plane is assigned to each magnetic-field sensor of the plurality of magnetic-field sensors; and adjusting a respective output signal provided by a respective magnetic-field sensor with a weighting factor corresponding to a surface area of the corresponding surface segment.

11. The method as claimed in claim 10, wherein setting the electric compensation current through the compensation coil minimizes the output variables of the magnetic-field sensors.

12. The method as claimed in claim 10, wherein setting the electric compensation current includes multiplying each output variables of the plurality of magnetic-field sensors by a corresponding weighting factor.

13. The method as claimed in claim 10, determining the magnitude of the electric current through the electrical conductor includes calculating a product of the compensation current through the compensation coil and a number of windings in the compensation coil.

* * * * *